(12) United States Patent
Tu et al.

(10) Patent No.: US 11,736,070 B2
(45) Date of Patent: Aug. 22, 2023

(54) AMPLIFIER CIRCUIT

(71) Applicant: Realtek Semiconductor Corporation, Hsinchu (TW)

(72) Inventors: Chih-Chan Tu, Hsinchu (TW); Chih-Lung Chen, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 107 days.

(21) Appl. No.: 17/406,248

(22) Filed: Aug. 19, 2021

(65) Prior Publication Data
US 2022/0149791 A1 May 12, 2022

(30) Foreign Application Priority Data

Nov. 11, 2020 (TW) ................................ 109139307

(51) Int. Cl.
*H03F 3/45* (2006.01)
*H03F 1/38* (2006.01)
*H03F 1/34* (2006.01)

(52) U.S. Cl.
CPC ................ *H03F 1/38* (2013.01); *H03F 1/34* (2013.01); *H03F 3/45* (2013.01);
(Continued)

(58) Field of Classification Search
CPC ..... H03F 1/38; H03F 1/34; H03F 3/45; H03F 2200/153; H03F 2200/408;
(Continued)

(56) References Cited

U.S. PATENT DOCUMENTS

| 7,079,646 | B2 * | 7/2006 | Chaplik | ............... | H04M 11/062 |
| | | | | | 379/93.05 |
| 9,184,730 | B2 * | 11/2015 | Wang | ..................... | H05B 45/14 |
| 2017/0026007 | A1 | 1/2017 | Zhang et al. | | |

OTHER PUBLICATIONS

Ka Nang Leung et al, "Analysis of Multistage Amplifier-Frequency Compensation," IEEE Transactions on Circuits and Systems I: Fundamental Theory and Applications, vol. 48, No. 9, pp. 1041-1056, Sep. 2001.

(Continued)

*Primary Examiner* — Andrea Lindgren Baltzell
*Assistant Examiner* — Khiem D Nguyen
(74) *Attorney, Agent, or Firm* — Locke Lord LLP; Tim Tingkang Xia, Esq.

(57) ABSTRACT

An amplifier circuit includes a multistage amplifier, a first feedback circuit and a second feedback circuit. The multistage amplifier includes a first-staged amplifier, a last-staged amplifier and at least one middle-staged amplifier cascaded between the first-staged amplifier and the last-staged amplifier. The first feedback circuit is configured to couple a positive output end of the last-staged amplifier to a positive input end of the at least one middle-staged amplifier, or is configured to couple a negative output end of the last-staged amplifier to a negative input end of the at least one middle-staged amplifier. The second feedback circuit is configured to couple the positive output end of the last-staged amplifier to a positive input end of the last-staged amplifier, or is configured to couple the negative output end of the last-staged amplifier to a negative input end of the last-staged amplifier.

15 Claims, 2 Drawing Sheets

(52) U.S. Cl.
CPC .. *H03F 2200/153* (2013.01); *H03F 2200/408* (2013.01); *H03F 2203/45526* (2013.01)

(58) Field of Classification Search
CPC .. H03F 2203/45526; H03F 1/083; H03F 1/42; H03F 3/45475
USPC .......................... 330/98, 253, 254, 258, 260
See application file for complete search history.

(56) References Cited

OTHER PUBLICATIONS

M. Abdulaziz et al, "A Compensation Technique for Two-Stage Differential OTAs," IEEE Transactions on Circuits and Systems II: Express Briefs, vol. 61, Issue 8, Aug. 2014.

* cited by examiner

AMPLIFIER CIRCUIT

CROSS-REFERENCE TO RELATED APPLICATION

This application claims priority to Taiwan Application Serial Number 109139307, filed Nov. 11, 2020, which is herein incorporated by reference in its entirety.

BACKGROUND

Field of Invention

This disclosure relates to an amplifier circuit, and in particular to an amplifier circuit having compensating circuit.

Description of Related Art

Generally speaking, the conventional operation amplifier is usually the two-staged amplifier circuit. A first pole and a second pole are often separated by Miller compensation so as to improve phase. However, that might cause the decrease in gain bandwidth product or 3-dB bandwidth.

SUMMARY

An aspect of present disclosure relates to an amplifier circuit. The amplifier circuit includes a multistage amplifier, a first feedback circuit and a second feedback circuit. The multistage amplifier includes a first-staged amplifier, a last-staged amplifier and at least one middle-staged amplifier cascaded between the first-staged amplifier and the last-staged amplifier. The first feedback circuit is configured to couple a positive output end of the last-staged amplifier to a positive input end of the at least one middle-staged amplifier, or is configured to couple a negative output end of the last-staged amplifier to a negative input end of the at least one middle-staged amplifier. The second feedback circuit is configured to couple the positive output end of the last-staged amplifier to a positive input end of the last-staged amplifier, or is configured to couple the negative output end of the last-staged amplifier to a negative input end of the last-staged amplifier.

Another aspect of present disclosure relates to an amplifier circuit. The amplifier circuit includes a multistage amplifier, a negative feedback circuit and a positive feedback circuit. The multistage amplifier includes a first-staged amplifier, a last-staged amplifier and at least one middle-staged amplifier cascaded between the first-staged amplifier and the last-staged amplifier. The negative feedback circuit is coupled to an output end of the last-staged amplifier and is configured to provide a negative feedback to an input end of the at least one middle-staged amplifier and to an input end of the last-staged amplifier. The positive feedback circuit is coupled to the output end of the last-staged amplifier and is configured to provide a positive feedback to the input end of the at least one middle-staged amplifier.

Another aspect of present disclosure relates to an amplifier circuit. The amplifier circuit includes a multistage amplifier, a negative feedback circuit and a positive feedback circuit. The multistage amplifier includes a first-staged amplifier, a last-staged amplifier and at least one middle-staged amplifier cascaded between the first-staged amplifier and the last-staged amplifier. The negative feedback circuit is coupled to an output end of the last-staged amplifier and is configured to provide a negative feedback to an input end of the at least one middle-staged amplifier and to an input end of the last-staged amplifier. The positive feedback circuit is coupled to the output end of the last-staged amplifier and is configured to provide a positive feedback to the input end of the last-staged amplifier.

By the design of the above-described positive feedback circuit, the amplifier circuit of the present disclosure can increase the 3-dB bandwidth under the condition that the unity gain frequency is not affected. In addition, the amplifier circuit of the present disclosure can increase the gain by the design of the above-described multistage amplifier.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "first", "second", etc. used in this specification do not specifically refer to order or sequence, nor are they intended to limit this disclosure. They are only used to distinguish the components or operations described in the same technical terms.

The terms "coupled" or "connected" as used herein may mean that two or more elements are directly in physical or electrical contact, or are indirectly in physical or electrical contact with each other. It can also mean that two or more elements interact with each other.

Figure 1:
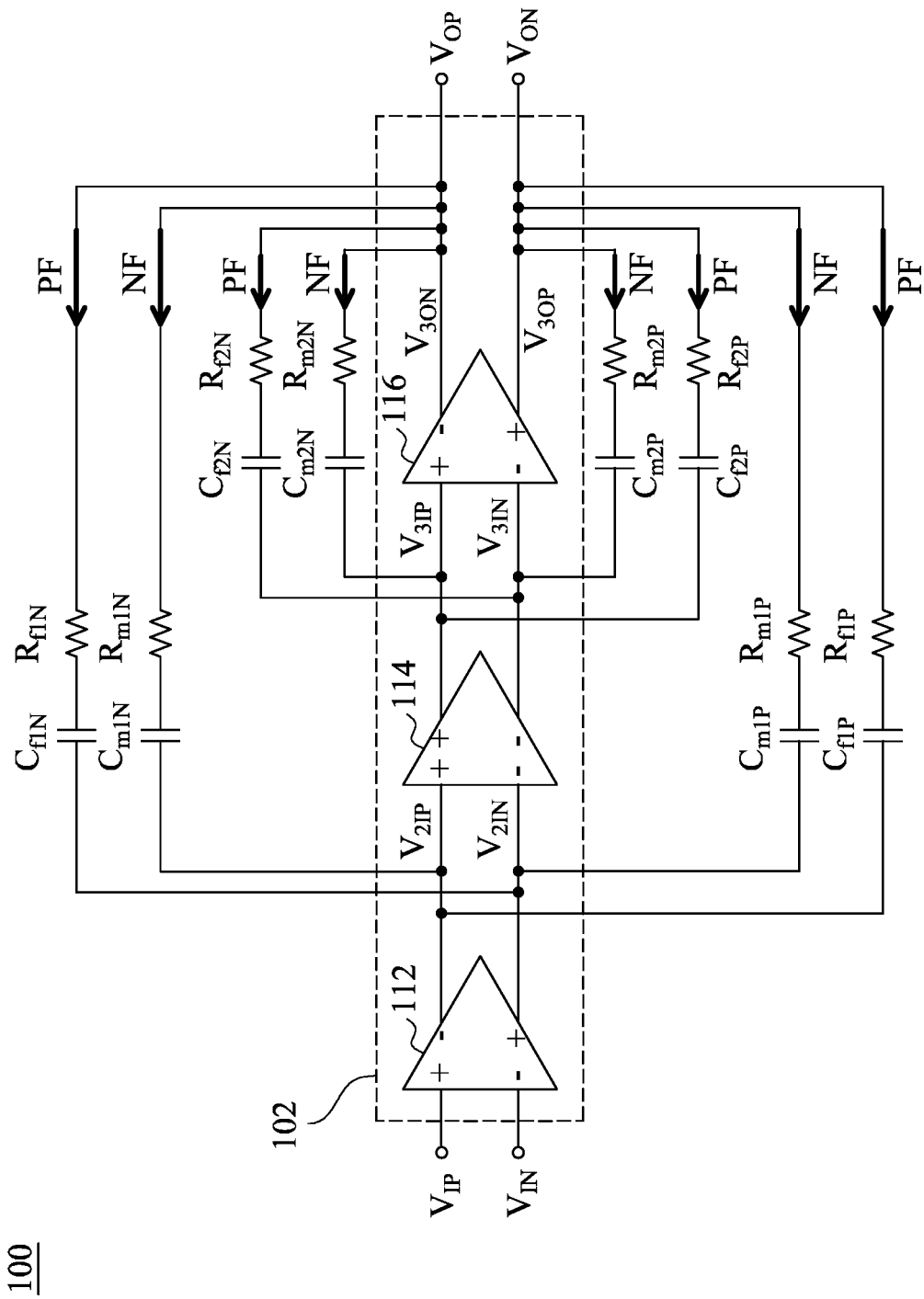
FIG. 1 is a schematic diagram of an amplifier circuit depicted according to some embodiments of the present disclosure.

Referring to FIG. 1, an embodiment of the present disclosure relates to an amplifier circuit 100. The amplifier circuit 100 includes a multistage amplifier 102, a negative feedback circuit and a positive feedback circuit. The multistage amplifier 102 includes a first-staged amplifier 112, a last-staged amplifier 116 and at least one middle-staged amplifier 114 cascaded between the first-staged amplifier 112 and the last-staged amplifier 116.

In the present embodiment, the first-staged amplifier 112, the middle-staged amplifier 114 and the last-staged amplifier 116 are all differential amplifier. That is to say, the first-staged amplifier 112 includes a positive input end (which is same as a positive input end $V_{IP}$ of the multistage amplifier 102), a negative input end (which is same as a negative input end $V_{IN}$ of the multistage amplifier 102), a positive output end and a negative output end. The middle-staged amplifier 114 and the last-staged amplifier 116 each includes similar structure, therefore the descriptions thereof are omitted herein.

In structure, the positive feedback circuit is coupled to one of output ends of the last-staged amplifier 116 and is configured to provide a positive feedback PF to one of input ends of the middle-staged amplifier 114 and to one of input ends of the last-staged amplifier 116. In the present embodiment, the positive feedback circuit includes a first feedback circuit and a second feedback circuit.

Specifically, the first feedback circuit includes first compensating resistors $R_{f1P}$, $R_{f1N}$ and first compensating capacitors $C_{f1P}$, $C_{f1N}$. The first feedback circuit is configured to couple a positive output end $V_{3OP}$ (which is same as a negative output end $V_{ON}$ of the multistage amplifier 102) of the last-staged amplifier 116 to a positive input end $V_{2IP}$ of the middle-staged amplifier 114, and is configured to couple a negative output end $V_{3ON}$ (which is same as a positive output end $V_{OP}$ of the multistage amplifier 102) of the last-staged amplifier 116 to a negative input end $V_{2IN}$ of the middle-staged amplifier 114.

As shown in FIG. 1, the first compensating resistor $R_{f1P}$ is coupled between the first compensating capacitor $C_{f1P}$ and the positive output end $V_{3OP}$ of the last-staged amplifier 116. The first compensating capacitor $C_{f1P}$ is coupled between the first compensating resistor $R_{f1P}$ and the positive input end $V_{2IP}$ of the middle-staged amplifier 114. The first compensating resistor $R_{f1N}$ is coupled between the first compensating capacitor $C_{f1N}$ and the negative output end $V_{3ON}$ of the last-staged amplifier 116. The first compensating capacitor $C_{f1N}$ is coupled between the first compensating resistor $R_{f1N}$ and the negative input end $V_{2IN}$ of the middle-staged amplifier 114.

The second feedback circuit includes second compensating resistors $R_{f2P}$, $R_{f2N}$ and second compensating capacitors $C_{f2P}$, $C_{f2N}$. The second feedback circuit is configured to couple the positive output end $V_{3OP}$ of the last-staged amplifier 116 to a positive input end $V_{3IP}$ of the last-staged amplifier 116, and is configured to couple the negative output end $V_{3ON}$ of the last-staged amplifier 116 to a negative input end $V_{3IN}$ of the last-staged amplifier 116.

As shown in FIG. 1 again, the second compensating resistor $R_{f2P}$ is coupled between the second compensating capacitor $C_{f2P}$ and the positive output end $V_{3OP}$ of the last-staged amplifier 116. The second compensating capacitor $C_{f2P}$ is coupled between the second compensating resistor $R_{f2P}$ and the positive input end $V_{3IP}$ of the last-staged amplifier 116. The second compensating resistor $R_{f2N}$ is coupled between the second compensating capacitor $C_{f2N}$ and the negative output end $V_{3ON}$ of the last-staged amplifier 116. The second compensating capacitor $C_{f2N}$ is coupled between the second compensating resistor $R_{f2N}$ and the negative input end $V_{3IN}$ of the last-staged amplifier 116.

The negative feedback circuit is coupled to one of output ends of the last-staged amplifier 116 and is configured to provide a negative feedback NF to one of input ends of middle-staged amplifier 114 and to one of input ends of last-staged amplifier 116. In the present embodiment, the negative feedback circuit includes a third feedback circuit and a fourth feedback circuit.

Specifically, the third feedback circuit includes third compensating resistors $R_{m1P}$, $R_{m1N}$ and third compensating capacitors $C_{m1P}$, $C_{m1N}$. The third feedback circuit is configured to couple the positive output end $V_{3OP}$ of the last-staged amplifier 116 to the negative input end $V_{2IN}$ of the middle-staged amplifier 114, and is configured to couple the negative output end $V_{3ON}$ of the last-staged amplifier 116 to the positive input end $V_{2IP}$ of the middle-staged amplifier 114.

As shown in FIG. 1, the third compensating resistor $R_{m1P}$ is coupled between the third compensating capacitor $C_{m1P}$ and the positive output end $V_{3OP}$ of the last-staged amplifier 116. The third compensating capacitor $C_{m1P}$ is coupled between the third compensating resistor $R_{m1P}$ and the negative input end $V_{2IN}$ of the middle-staged amplifier 114. The third compensating resistor $R_{m1N}$ is coupled between the third compensating capacitor $C_{m1N}$ and the negative output end $V_{3ON}$ of the last-staged amplifier 116. The third compensating capacitor $C_{m1N}$ is coupled between the third compensating resistor $R_{m1N}$ and the positive input end $V_{2IP}$ of the middle-staged amplifier 114.

The fourth feedback circuit includes fourth compensating resistors $R_{m2P}$, $R_{m2N}$ and fourth compensating capacitors $C_{m2P}$, $C_{m2N}$. The fourth feedback circuit is configured to couple the positive output end $V_{3OP}$ of the last-staged amplifier 116 to the negative input end $V_{3IN}$ of the last-staged amplifier 116, and is configured to couple the negative output end $V_{3ON}$ of the last-staged amplifier 116 to the positive input end $V_{3IP}$ of the last-staged amplifier 116.

As shown in FIG. 1 again, the fourth compensating resistor $R_{m2P}$ is coupled between the fourth compensating capacitor $C_{m2P}$ and the positive output end $V_{3OP}$ of the last-staged amplifier 116. The fourth compensating capacitor $C_{m2P}$ is coupled between the fourth compensating resistor $R_{m2P}$ and the negative input end $V_{3IN}$ of the last-staged amplifier 116. The fourth compensating resistor $R_{m2N}$ is coupled between the fourth compensating capacitor $C_{m2N}$ and the negative output end $V_{3ON}$ of the last-staged amplifier 116. The fourth compensating capacitor $C_{m2N}$ is coupled between the fourth compensating resistor $R_{m2N}$ and the positive input end $V_{3IP}$ of the last-staged amplifier 116.

It is understood that when the number of middle-staged amplifiers 114 is at least two, the positive feedback circuit can be configured to provide the positive feedback PF to one of input ends of each of middle-staged amplifiers 114 and to one of input ends of the last-staged amplifier 116.

In other some embodiments, the position of the compensating capacitor (e.g. the first compensating capacitor $C_{f1P}$) and the position of the compensating resistor (e.g. the first compensating resistor $R_{f1P}$) can be exchanged. In other words, the first compensating capacitor $C_{f1P}$ is coupled between the first compensating resistor $R_{f1P}$ and the positive output end $V_{3OP}$ of the last-staged amplifier 116. The first compensating resistor $R_{f1P}$ is coupled between the first compensating capacitor $C_{f1P}$ and the positive input end $V_{2IP}$ of the middle-staged amplifier 114. The arrangement of other compensating capacitors and compensating resistors is similar to those of the first compensating capacitor $C_{f1P}$ and the first compensating resistor $R_{f1P}$, therefore the descriptions thereof are omitted.

In other some embodiments, the positive feedback circuit and the negative feedback circuit can include only three circuits of the first feedback circuit, the second feedback circuit, the third feedback circuit and the fourth feedback circuit. For example, the second feedback circuit (including the second compensating resistors $R_{f2P}$, $R_{f2N}$ and the second compensating capacitors $C_{f2P}$, $C_{f2N}$) as shown in FIG. 1 can be omitted.

Figure 2:
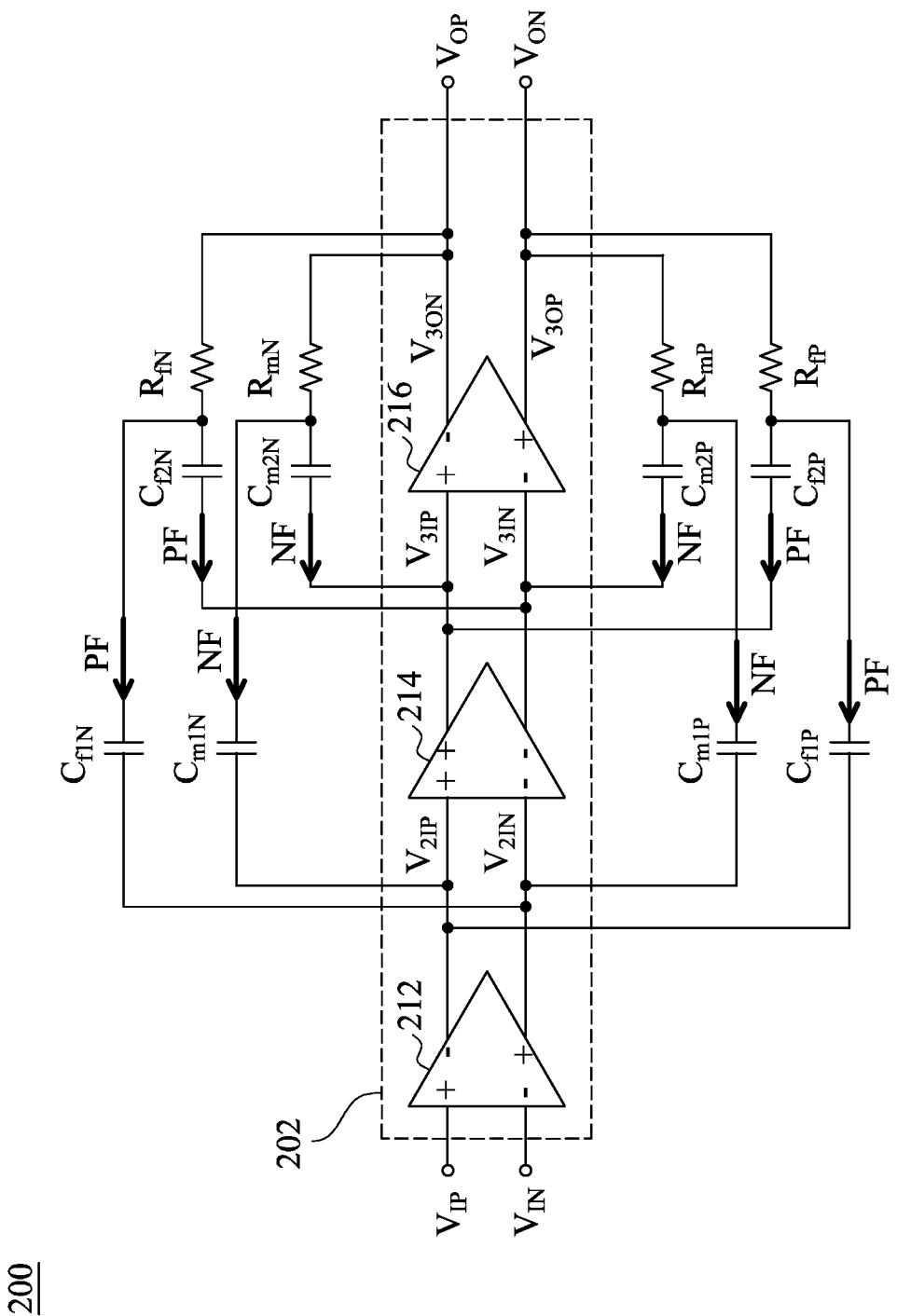
FIG. 2 is a schematic diagram of an amplifier circuit depicted according to other some embodiments of the present disclosure.

Referring to FIG. 2, another embodiment of the present disclosure relates to an amplifier circuit 200. The amplifier circuit 200 includes a multistage amplifier 202, a negative feedback circuit and a positive feedback circuit. The multistage amplifier 202 includes a first-staged amplifier 212, a last-staged amplifier 216 and at least one middle-staged amplifier 214 cascaded between the first-staged amplifier 212 and the last-staged amplifier 216. In the present embodiment, the description of the arrangements of the amplifier circuit 200 similar to those of the amplifier circuit 100 is omitted.

In structure, the positive feedback circuit includes a first feedback circuit and a second feedback circuit. Specifically, the first feedback circuit includes first compensating resistors $R_{fP}$, $R_{fN}$ and first compensating capacitors $C_{f1P}$, $C_{f1N}$. As shown in FIG. 2, the first compensating resistor $R_{fP}$ is coupled between the first compensating capacitor $C_{f1P}$ and a positive output end $V_{3OP}$ of the last-staged amplifier 216. The first compensating capacitor $C_{f1P}$ is coupled between the first compensating resistor $R_{fP}$ and a positive input end $V_{2IP}$ of the middle-staged amplifier 214. The first compensating resistor $R_{fN}$ is coupled between the first compensating capacitor $C_{f1N}$ and a negative output end $V_{3ON}$ of the last-staged amplifier 216. The first compensating capacitor $C_{f1N}$ is coupled between the first compensating resistor $R_{fN}$ and a negative input end $V_{2IN}$ of the middle-staged amplifier 214.

The second feedback circuit includes second compensating capacitors $C_{f2P}$, $C_{f2N}$. As shown in FIG. 2 again, the second compensating capacitor $C_{f2P}$ is coupled between the first compensating resistor $R_{fP}$ and the positive input end $V_{3IP}$ of the last-staged amplifier 216, so as to provide the positive feedback PF. The second compensating capacitor $C_{f2N}$ is coupled between the first compensating resistor $R_{fN}$ and the negative input end $V_{3IN}$ of the last-staged amplifier 216, so as to provide the positive feedback PF.

The negative feedback circuit includes a third feedback circuit and a fourth feedback circuit. Specifically, the third feedback circuit includes third compensating resistors $R_{mP}$, $R_{mN}$ and third compensating capacitors $C_{m1P}$, $C_{m1N}$. As shown in FIG. 2, the third compensating resistor $R_{mP}$ is coupled between the third compensating capacitor $C_{m1P}$ and the positive output end $V_{3OP}$ of the last-staged amplifier 216. The third compensating capacitor $C_{m1P}$ is coupled between the third compensating resistor $R_{mP}$ and the negative input end $V_{2IN}$ of the middle-staged amplifier 214. The third compensating resistor $R_{mN}$ is coupled between the third compensating capacitor $C_{m1N}$ and the negative output end $V_{3ON}$ of the last-staged amplifier 216. The third compensating capacitor $C_{m1N}$ is coupled between the third compensating resistor $R_{mN}$ and the positive input end $V_{2IP}$ of the middle-staged amplifier 214.

The fourth feedback circuit includes fourth compensating capacitors $C_{m2P}$, $C_{m2N}$. As shown in FIG. 2 again, the fourth compensating capacitor $C_{m2P}$ is coupled between the third compensating resistor $R_{mP}$ and the negative input end $V_{3IN}$ of the last-staged amplifier 216, so as to provide the negative feedback NF. The fourth compensating capacitor $C_{m2N}$ is coupled between the third compensating resistor $R_{mN}$ and the positive input end $V_{3IP}$ of the last-staged amplifier 216, so as to provide the negative feedback NF.

By the design of the above-described positive feedback circuit, the amplifier circuit 100, 200 of the present disclosure can increase the 3-dB bandwidth under the condition that the unity gain frequency is not affected. In addition, the amplifier circuit 100, 200 of the present disclosure can increase the gain by the design of the above-described multistage amplifier.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. An amplifier circuit, comprising:
   a multistage amplifier comprising a first-staged amplifier, a last-staged amplifier and at least one middle-staged amplifier cascaded between the first-staged amplifier and the last-staged amplifier;
   a first feedback circuit configured to couple a positive output end of the last-staged amplifier to a positive input end of the at least one middle-staged amplifier, or configured to couple a negative output end of the last-staged amplifier to a negative input end of the at least one middle-staged amplifier; and
   a second feedback circuit configured to couple the positive output end of the last-staged amplifier to a positive input end of the last-staged amplifier, or configured to couple the negative output end of the last-staged amplifier to a negative input end of the last-staged amplifier,
   wherein the first feedback circuit comprises a first compensating resistor and a first compensating capacitor, and the second feedback circuit comprises a second compensating capacitor,
   if the first compensating resistor is coupled between the first compensating capacitor and the positive output end of the last-staged amplifier, and the first compensating capacitor is coupled between the first compensating resistor and the positive input end of the at least one middle-staged amplifier, the second compensating capacitor will be coupled between the positive input end of the last-staged amplifier and a node between the first compensating resistor and the first compensating capacitor; and
   if the first compensating resistor is coupled between the first compensating capacitor and the negative output end of the last-staged amplifier, and the first compensating capacitor is coupled between the first compensating resistor and the negative input end of the at least one middle-staged amplifier, the second compensating capacitor will be coupled between the negative input end of the last-staged amplifier and a node between the first compensating resistor and the first compensating capacitor.

2. The amplifier circuit of claim 1, wherein the second feedback circuit further comprises a second compensating resistor.

3. The amplifier circuit of claim 2, wherein the second compensating resistor is coupled between the second compensating capacitor and the positive output end of the last-staged amplifier, and the second compensating capacitor is coupled between the second compensating resistor and the positive input end of the last-staged amplifier.

4. The amplifier circuit of claim 2, wherein the second compensating resistor is coupled between the second compensating capacitor and the negative output end of the last-staged amplifier, and the second compensating capacitor is coupled between the second compensating resistor and the negative input end of the last-staged amplifier.

5. The amplifier circuit of claim 1, further comprising:
   a third feedback circuit configured to couple the positive output end of the last-staged amplifier to the negative input end of the at least one middle-staged amplifier, or configured to couple the negative output end of the last-staged amplifier to the positive input end of the at least one middle-staged amplifier.

6. The amplifier circuit of claim 5, wherein the third feedback circuit comprises a third compensating resistor and a third compensating capacitor.

7. The amplifier circuit of claim 6, wherein the third compensating resistor is coupled between the third compensating capacitor and the positive output end of the last-staged amplifier, and the third compensating capacitor is coupled between the third compensating resistor and the negative input end of the at least one middle-staged amplifier.

8. The amplifier circuit of claim 6, wherein the third compensating resistor is coupled between the third compensating capacitor and the negative output end of the last-staged amplifier, and the third compensating capacitor is coupled between the third compensating resistor and the positive input end of the at least one middle-staged amplifier.

9. The amplifier circuit of claim 1, further comprising:
a fourth feedback circuit configured to couple the positive output end of the last-staged amplifier to the negative input end of the last-staged amplifier, or configured to couple the negative output end of the last-staged amplifier to the positive input end of the last-staged amplifier.

10. The amplifier circuit of claim 9, wherein the fourth feedback circuit comprises a fourth compensating resistor and a fourth compensating capacitor.

11. The amplifier circuit of claim 10, wherein the fourth compensating resistor is coupled between the fourth compensating capacitor and the positive output end of the last-staged amplifier, and the fourth compensating capacitor is coupled between the fourth compensating resistor and the negative input end of the last-staged amplifier.

12. The amplifier circuit of claim 10, wherein the fourth compensating resistor is coupled between the fourth compensating capacitor and the negative output end of the last-staged amplifier, and the fourth compensating capacitor is coupled between the fourth compensating resistor and the positive input end of the last-staged amplifier.

13. An amplifier circuit, comprising:
a multistage amplifier comprising a first-staged amplifier, a last-staged amplifier and at least one middle-staged amplifier cascaded between the first-staged amplifier and the last-staged amplifier;
a negative feedback circuit coupled to an output end of the last-staged amplifier and configured to provide a negative feedback to an input end of the at least one middle-staged amplifier and to an input end of the last-staged amplifier; and
a positive feedback circuit coupled to the output end of the last-staged amplifier and configured to provide a positive feedback to the input end of the at least one middle-staged amplifier,
wherein each of the negative feedback circuit and the positive feedback circuit comprises a first feedback circuit and a second feedback circuit, each of the first feedback circuits comprises a first compensating resistor and a first compensating capacitor, and each of the second feedback circuits comprises a second compensating capacitor,
if the first compensating resistor is coupled between the first compensating capacitor and a positive output end of the last-staged amplifier, and the first compensating capacitor is coupled between the first compensating resistor and a positive input end of the at least one middle-staged amplifier, the second compensating capacitor will be coupled between a positive input end of the last-staged amplifier and a node between the first compensating resistor and the first compensating capacitor; and
if the first compensating resistor is coupled between the first compensating capacitor and a negative output end of the last-staged amplifier, and the first compensating capacitor is coupled between the first compensating resistor and a negative input end of the at least one middle-staged amplifier, the second compensating capacitor will be coupled between a negative input end of the last-staged amplifier and a node between the first compensating resistor and the first compensating capacitor.

14. The amplifier circuit of claim 13, wherein the positive feedback circuit is further configured to provide the positive feedback to the input end of the last-staged amplifier.

15. An amplifier circuit, comprising:
a multistage amplifier comprising a first-staged amplifier, a last-staged amplifier and at least one middle-staged amplifier cascaded between the first-staged amplifier and the last-staged amplifier;
a negative feedback circuit coupled to an output end of the last-staged amplifier and configured to provide a negative feedback to an input end of the at least one middle-staged amplifier and to an input end of the last-staged amplifier; and
a positive feedback circuit coupled to the output end of the last-staged amplifier and configured to provide a positive feedback to the input end of the last-staged
wherein each of the negative feedback circuit and the positive feedback circuit comprises a first feedback circuit and a second feedback circuit, each of the first feedback circuits comprises a first compensating resistor and a first compensating capacitor, and each of the second feedback circuits comprises a second compensating capacitor,
if the first compensating resistor is coupled between the first compensating capacitor and a positive output end of the last-staged amplifier, and the first compensating capacitor is coupled between the first compensating resistor and a positive input end of the at least one middle-staged amplifier, the second compensating capacitor will be coupled between a positive input end of the last-staged amplifier and a node between the first compensating resistor and the first compensating capacitor, and
if the first compensating resistor is coupled between the first compensating capacitor and a negative output end of the last-staged amplifier, and the first compensating capacitor is coupled between the first compensating resistor and a negative input end of the at least one middle-staged amplifier, the second compensating capacitor will be coupled between a negative input end of the last-staged amplifier and a node between the first compensating resistor and the first compensating capacitor.

\* \* \* \* \*